(12) United States Patent
Omori (10) Patent No.: US 11,940,785 B2
(45) Date of Patent: Mar. 26, 2024

(54) METHOD FOR PREDICTING MAINTENANCE FOR COMPONENTS USED IN SUBSTRATE TREATMENTS, AND PREDICTIVE MAINTENANCE DEVICE

(71) Applicant: ASM IP Holding B.V., Almere (NL)

(72) Inventor: Taku Omori, Akishima (JP)

(73) Assignee: ASM IP Holding B.V., Almere (NL)

( * ) Notice: Subject to any disclaimer, the term of this patent is extended or adjusted under 35 U.S.C. 154(b) by 66 days.

(21) Appl. No.: 17/498,999

(22) Filed: Oct. 12, 2021

(65) Prior Publication Data
US 2022/0121196 A1 Apr. 21, 2022

Related U.S. Application Data

(60) Provisional application No. 63/092,222, filed on Oct. 15, 2020.

(51) Int. Cl.
*G05B 23/02* (2006.01)
*H01L 21/67* (2006.01)

(52) U.S. Cl.
CPC ..... *G05B 23/0283* (2013.01); *G05B 23/0235* (2013.01); *G05B 23/0272* (2013.01); *H01L 21/67017* (2013.01); *H01L 21/67253* (2013.01); *H01L 21/67011* (2013.01)

(58) Field of Classification Search
CPC ............ G05B 23/0283; G05B 23/0235; G05B 23/0272; G05B 19/0423; H01L 21/67017; H01L 21/67253; H01L 21/67011
See application file for complete search history.

(56) References Cited

U.S. PATENT DOCUMENTS

| | | | |
|---|---|---|---|
| 4,145,699 | A | 3/1979 | Hu et al. |
| 4,804,086 | A | 2/1989 | Grohrock |
| 4,991,614 | A | 2/1991 | Hammel |
| 5,308,788 | A | 5/1994 | Fitch et al. |
| 5,820,685 | A | 10/1998 | Kurihara et al. |
| 6,746,240 | B2 | 6/2004 | de Ridder et al. |
| 7,569,193 | B2 | 8/2009 | Ferron et al. |
| 8,318,584 | B2 | 11/2012 | Li et al. |

(Continued)

FOREIGN PATENT DOCUMENTS

| | | |
|---|---|---|
| CN | 205448240 | 8/2016 |
| CN | 107675144 | 2/2018 |

(Continued)

OTHER PUBLICATIONS

CNIPA; Office Action dated Setp. 9, 2016 in Application No. 201280057542.1.

(Continued)

*Primary Examiner* — Kenneth M Lo
*Assistant Examiner* — Jonathan Michael Skrzycki
(74) *Attorney, Agent, or Firm* — Snell & Wilmer L.L.P.

(57) ABSTRACT

Examples of a predictive maintenance method includes determining whether analog data measured in a substrate treatment that has used a recipe exceeds an allowable threshold which corresponds to the recipe and has been determined beforehand, and notifying, in a case where it is determined that the analog data exceeds the allowable threshold in the determination, a user that a relating module which has been associated with the analog data beforehand has deteriorated.

17 Claims, 5 Drawing Sheets

(56) References Cited

U.S. PATENT DOCUMENTS

| | | |
|---|---|---|
| D715,410 S | 10/2014 | Lohmann |
| 8,991,887 B2 | 3/2015 | Shin et al. |
| D735,836 S | 8/2015 | Yamagishi et al. |
| 9,911,595 B1 | 3/2018 | Smith et al. |
| D825,505 S | 8/2018 | Hanson et al. |
| 10,395,919 B2 | 8/2019 | Masaru et al. |
| 2002/0027945 A1 | 3/2002 | Hirano et al. |
| 2003/0014145 A1* | 1/2003 | Reiss ............... G05B 23/0286 700/121 |
| 2004/0112288 A1 | 6/2004 | Whitesell |
| 2005/0208718 A1 | 9/2005 | Lim et al. |
| 2005/0267621 A1* | 12/2005 | Sato ............... H01L 21/67248 700/121 |
| 2005/0288817 A1* | 12/2005 | Chen ............... H01L 21/67253 700/213 |
| 2006/0215338 A1* | 9/2006 | Yokouchi ........... H01L 21/6831 361/56 |
| 2007/0166459 A1 | 7/2007 | Chang et al. |
| 2010/0119727 A1 | 5/2010 | Takagi |
| 2012/0077350 A1 | 3/2012 | Miya et al. |
| 2013/0147050 A1 | 6/2013 | Bonner, III et al. |
| 2013/0162142 A1 | 6/2013 | Nishino et al. |
| 2013/0203258 A1 | 8/2013 | Chen et al. |
| 2018/0076021 A1 | 3/2018 | Fukushima et al. |
| 2021/0041284 A1 | 2/2021 | Yednak |
| 2021/0102289 A1 | 4/2021 | Tsuji et al. |
| 2021/0166940 A1 | 6/2021 | Nozawa |
| 2022/0375331 A1* | 11/2022 | Okuno ............... G05B 23/0235 |

FOREIGN PATENT DOCUMENTS

| | | |
|---|---|---|
| DE | 3836696 | 12/1989 |
| JP | 2002118066 | 4/2002 |
| JP | 2002237375 | 8/2002 |
| WO | 2018020327 | 2/2018 |

OTHER PUBLICATIONS

TIPO; Office Action dated Jun. 22, 2018 in Application No. 104105533.
USPTO; Final Office Action dated Feb. 20, 2020 in U.S. Appl. No. 14/444,744.
Atta et al. "The Catalytic Activity of Ruthenates $ARuO_3$ (A = Ca, Sr or Ba) for the Hydrogen Evolution Reaction in Acidic Medium" Int. J. Electrochem. Sci. 7, pp. 725-746 (2012).
KIPO; Office Action dated Jun. 23, 2021 in Application No. 10-2015-0037658.
USPTO; Final Office Action dated Aug. 4, 2021 in U.S. Appl. No. 14/219,879.
Lim et al. "Atomic layer deposition of transition metals" Nature Materials, vol. 2 pp. 749-754 (2003).
Vesters et al. "Sensitizers in EUV Chemically Amplified Resist: Mechanism of sensitivity improvement" Proc. SPIE 10583 Extreme Ultraviolet (EUV) Lithography IX, 1058307, 11 pages (2018).

* cited by examiner

| RECIPE | ANALOG DATA | ALLOWABLE THRESHOLD | RELATED MODULE | SAFETY DEGREE | HIGH LOAD RECIPE |
|---|---|---|---|---|---|
| R1 | AD1a | AT1a | Mass Flow Controller(MFC) | 0 — 100 | |
| | AD1b | AT1b | Auto pressure Controller(APC) | 0 — 100 | |
| | AD1c | AT1c | RF Generator | 0 — 100 | ✕ |
| | AD1d | AT1d | Photo detector Thermometer | 0 — 100 | |
| R2 | AD2a | AT2a | MFC | 0 — 100 | |
| | AD2b | AT2b | APC | 0 — 100 | |
| | AD2c | AT2c | RF Generator | 0 — 100 | |
| | AD2d | AT2d | Photo detector Thermometer | 0 — 100 | |
| R3 | AD3a | AT3a | MFC | 0 — 100 | ✕ |
| | AD3b | AT3b | APC | 0 — 100 | |
| | AD3c | AT3c | RF Generator | 0 — 100 | |
| | AD3d | AT3d | Photo detector Thermometer | 0 — 100 | |

METHOD FOR PREDICTING MAINTENANCE FOR COMPONENTS USED IN SUBSTRATE TREATMENTS, AND PREDICTIVE MAINTENANCE DEVICE

CROSS-REFERENCE TO RELATED APPLICATIONS

This application claims the benefit of and priority to U.S. Provisional Patent Application Ser. No. 63/092,222 filed Oct. 15, 2020, the disclosure of which is hereby incorporated by reference in its entirety.

FIELD

Examples are described which relate to a predictive maintenance method and a predictive maintenance device.

BACKGROUND

For example, in a semiconductor manufacturing apparatus, various modules are used to control or monitor a process. Examples of such modules include a mass flow controller (MFC), an auto pressure controller (APC), an RF generator, a photodetector and a temperature measurement device. The RF generator can generate high-frequency power having a predetermined waveform, and also measure plasma emission intensity or plasma emission time.

The module can deteriorate over the time due to some long-term use. If a module fails, the production activity will stop, and accordingly, it is necessary to detect the deterioration of the module before the module fails. However, a countermeasure of simply repairing or replacing the module against the deterioration of the module will result in repeating the same deterioration process many times.

SUMMARY

Some examples described herein may address the above-described problems. Some examples described herein may provide a predictive maintenance method and a predictive maintenance device which can improve a system and improve a recipe.

In some examples, a predictive maintenance method includes determining whether analog data measured in a substrate treatment that has used a recipe exceeds an allowable threshold which corresponds to the recipe and has been determined beforehand, and notifying, in a case where it is determined that the analog data exceeds the allowable threshold in the determination, a user that a relating module which has been associated with the analog data beforehand has deteriorated.

DETAILED DESCRIPTION

Figure 1:
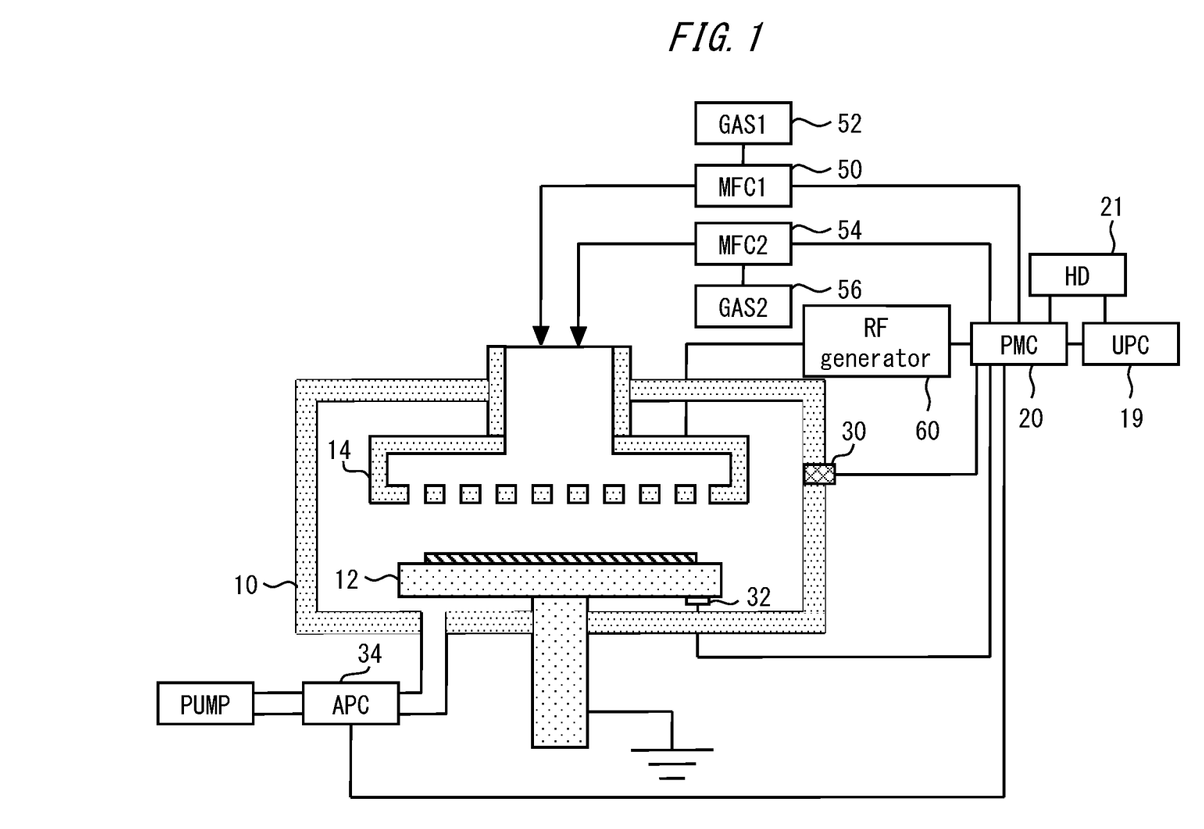
FIG. 1 illustrates a view illustrating a configuration example of a system.

FIG. 1 is a view illustrating a configuration example of a system which includes a predictive maintenance device.

This system includes a Unique Platform Controller (UPC) 19, a Process Module Controller (PMC) 20, and a storage medium 21. According to one example, the UPC 19, the PMC 20 and the storage medium 21 function as the predictive maintenance device.

This system includes a chamber 10; and a stage 12 and a shower head 14 which are provided in the chamber 10. A parallel plate structure is provided by the stage 12 and the shower head 14. A gas of which the flow rate is controlled by a mass flow controller 50 is supplied from a gas source 52 to a space between the stage 12 and the shower head 14, through slits of the shower head 14. A gas of which the flow rate is controlled by a mass flow controller 54 is supplied from a gas source 56 to a space between the stage 12 and the shower head 14, through the slits of the shower head 14. According to one example, these gases are used for treatment of a substrate provided on the stage 12. According to another example, another gas can be used.

An RF generator 60 applies high-frequency power to the shower head 14 via, for example, an RF sensor and a matching box, on the basis of a command from the PMC 20. A photodetector 30 converts plasma light which is generated in a space between the stage 12 and the shower head 14, into a voltage, and outputs the voltage. An auto pressure controller (APC) 34 discharges a gas which has been used for substrate treatment or chamber cleaning, to the outside of the chamber 10. The treatment of the substrate with the use of this system is, for example, film formation with the use of plasma, etching with the use of plasma, or modification of a film with the use of plasma. According to one example, this system is provided as a PEALD apparatus or a pulse CVD apparatus.

According to one example, a module to be used for the treatment of the substrate is controlled by the PMC 20. According to one example, a plurality of recipes are stored in the PMC 20, and the PMC 20 controls a module which is used for substrate treatment, according to the recipes. In the example of FIG. 1, an MFC 50, an MFC 54, the APC 34, the RF generator 60, the photodetector 30, and a temperature measuring device 32 are modules controlled by the PMC 20. According to another example, another module can be controlled.

The PMC 20 is a microcomputer, for example. According to one example, the PMC 20 functions as an abnormality detection controller. The PMC 20 can include a calculation unit, a storage unit, an alarm determination unit and a sensor monitoring unit. According to one example, the UPC 19 receives alarm signals from the PMC 20 and displays or records such alarm.

A storage medium 21 is connected to the PMC 20 and the UPC 19. The storage medium 21 is a portion in which necessary data for an operation of the substrate treatment apparatus is stored in, for example, a hard disk.

In this way, the UPC 19, the PMC 20 and the storage medium 21 function as a controller for the substrate treatment, and also function as a predictive maintenance device. The operation of the predictive maintenance device is roughly divided into a learning phase which is a preparatory stage, and a monitoring phase which executes the predictive maintenance operation.

Figure 2:
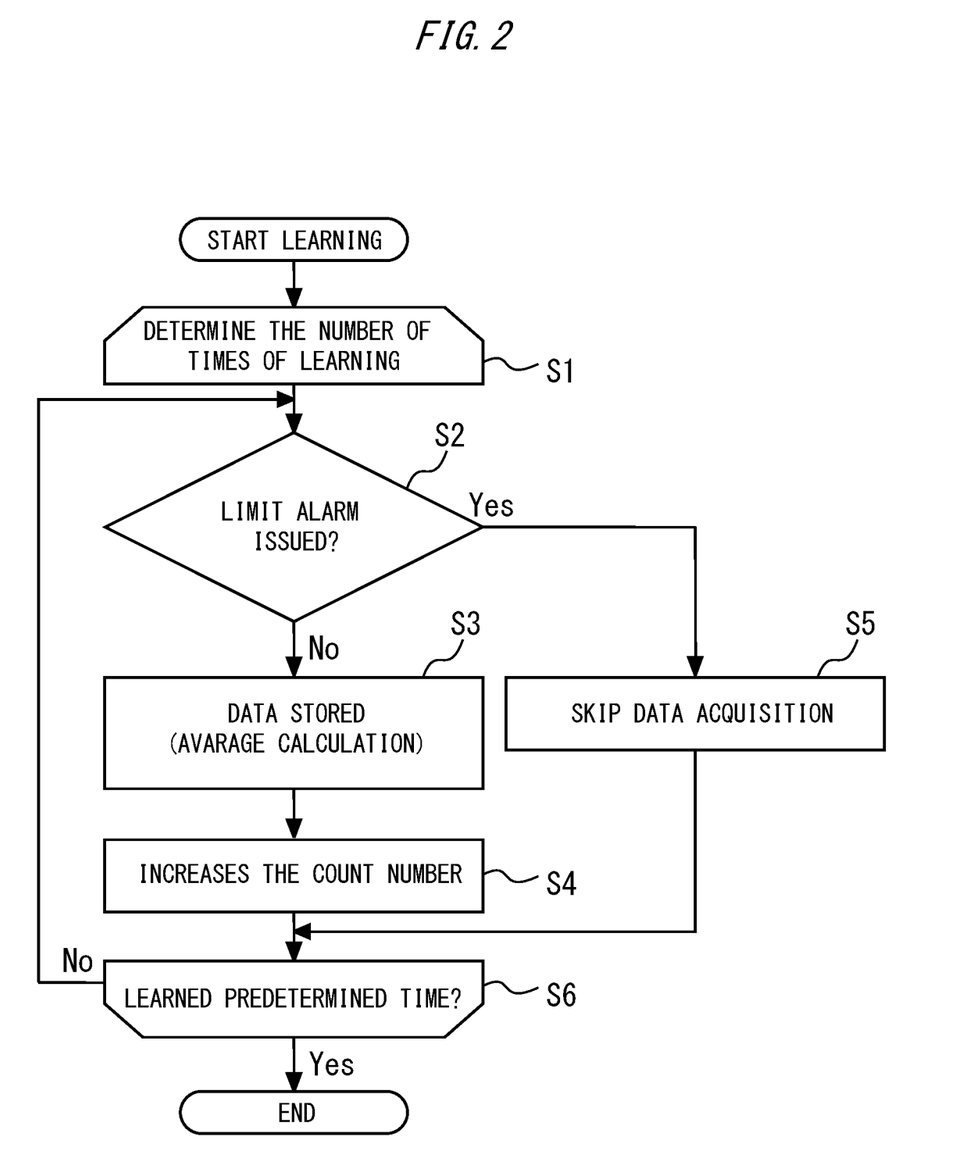
FIG. 2 is a flowchart of a learning phase.

FIG. 2 is a flowchart illustrating a processing example of the learning phase. In the learning phase, the controller determines the number of times of learning, in the first step S1. For example, its hall be determined here that the learning is performed five times. Next, in step S2, the controller subjects a dummy wafer to treatment according to a certain recipe, and determines whether analog data obtained by the treatment causes a limit alarm. The limit alarm is set so that the controller finds analog data which has deviated from an expected range due to an abnormality or the like.

An RF generator 60 applies high-frequency power to the shower head 14 via, for example, an RF sensor and a matching box, on the basis of a command from the PMC20. A photodetector 30 converts plasma light which is generated in a space between the stage 12 and the shower head 14, into a voltage, and outputs the voltage. An auto pressure controller (APC) 34 discharges a gas which has been used for substrate treatment or chamber cleaning, to the outside of the chamber 10. The treatment of the substrate with the use of this system is, for example, film formation with the use of plasma, etching with the use of plasma, or modification of a film with the use of plasma. According to one example, this system is provided as a Plasma Enhanced Atomic Layer Deposition (PEALD) apparatus or a pulse Chemical Vapor Deposition (CVD) apparatus.

The analog data which has been obtained without causing the limit alarm in the step S2 is stored as data in step S3. Next, the controller increases the count number by 1 time in step S4, and determines whether the process has finished a predetermined number of times of learning, in step S6. At the present time, one learning has been finished, and accordingly, the process returns to the step S2 again for the second learning. In this example, the controller subjects a plurality of dummy wafers to the treatment according to the same recipe, until five analog data by five learning processes are accumulated by the process of step S3.

The controller performs a plurality of learning processes, in this manner. By having subjected a plurality of dummy wafers to the treatment according to the same specific recipe, the controller can obtain an average value of a plurality of measured analog data, in the step S3. On the basis of the average value, for example, the controller determines an allowable threshold. If the analog data does not exceed the allowable threshold, the module will not fail, but if the analog data exceeds the allowable threshold, there is a concern that the module will fail. According to one example, the allowable threshold is a stricter criterion than the above limit alarm. In other words, analog data that has been output from a module which does not have a problem in normal use but has deteriorated to some extent due to aging does not satisfy the allowable threshold, in some cases. Accordingly, when the analog data has exceeded the allowable threshold, it cannot be necessarily said that the module has failed, but it can be said that the module is in a state in which the failure may occur sooner or later.

Subsequently, the controller performs such learning processes for other recipes, and determines an allowable threshold for each of the recipes. Then, the controller stores a plurality of recipes, and the allowable thresholds corresponding to the plurality of recipes, in the storage medium. According to one example, the controller acquires one analog data in treatment according to one recipe, and determines an allowable threshold for the analog data. According to another example, it is acceptable for the controller to acquire a plurality of analog data from different modules in treatment according to one recipe, and determine allowable thresholds concerning the respective analog data.

Furthermore, separately from the learning phase, the controller associates analog data with a relating module which is a module relating to the analog data, and stores the result in a storage medium, as needed. Deterioration of the relating module affects the analog data which is associated with the relating module. In other words, the controller associates a certain module with analog data affected by the deterioration of the module. Thereby, a correspondence between the analog data and the relating module is determined. According to one example, the analog data is output signals of flow rates of MFC 50 and MFC 54, and the relating modules are MFC 50 and MFC 54. According to another example, the analog data is a pressure signal of APC 34 and the relating module is APC 34. According to still another example, the analog data is a signal measured by the RF generator 60, a signal detected by the photodetector 30 and a signal measured by the temperature measuring device 32, and the respective relating modules are the RF generator 60, the photodetector 30 and the temperature measuring device 32.

According to another example, it is acceptable for the controller to omit such an association operation, and to determine a module which provides analog data, as a relating module of the analog data. According to still another example, it is acceptable to associate one analog data with a plurality of modules.

Figure 3:
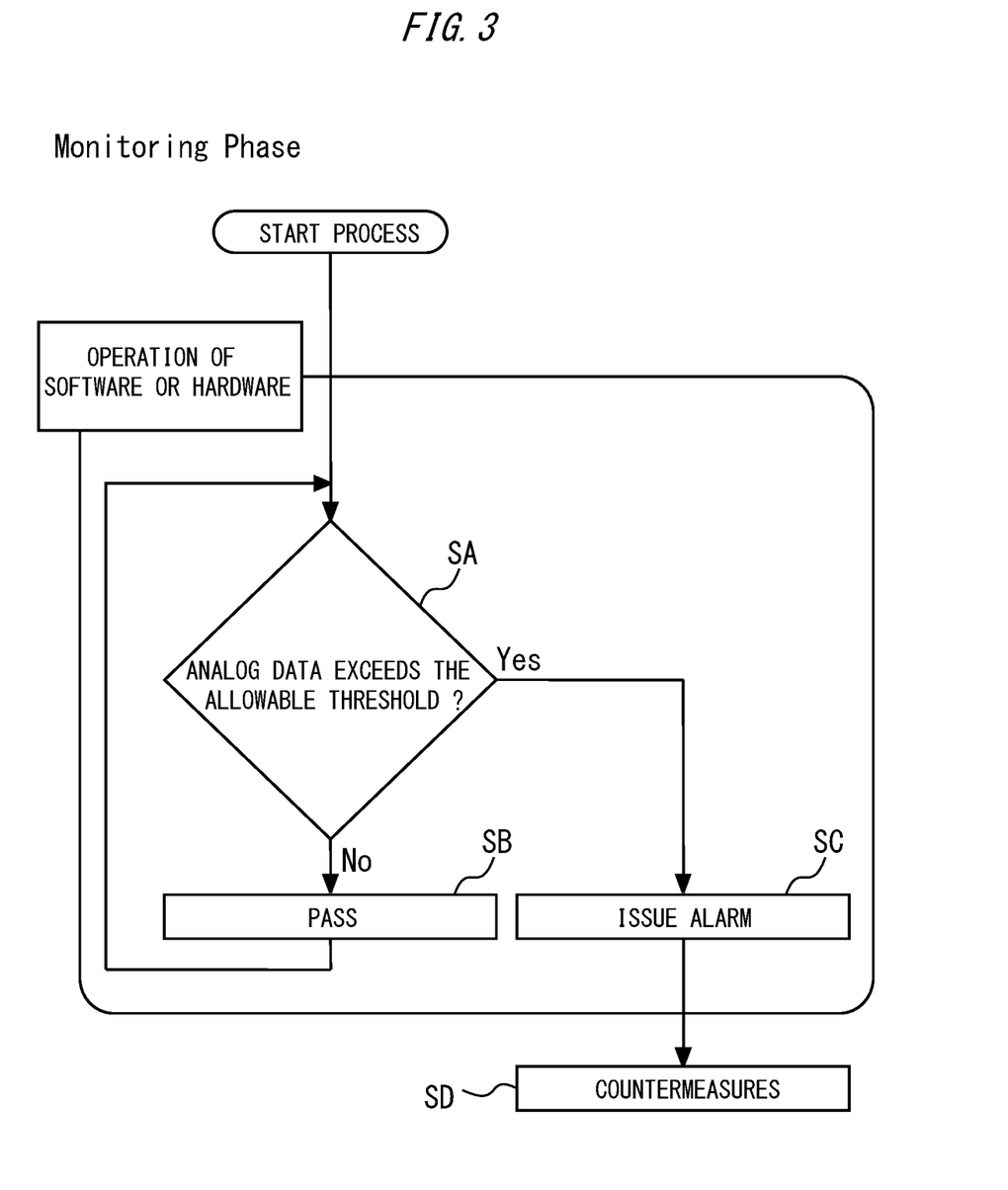
FIG. 3 is a flowchart of a monitoring phase.

FIG. 3 is a flowchart illustrating a processing example of a monitoring phase. The monitoring phase is a phase in which the controller performs the predictive maintenance of a module, when a product substrate is treated or after the treatment. The module can deteriorate over the time due to the treatment of the product substrate. According to one example, the controller specifies the recipe, and then monitor this deterioration over the time. In step SA of FIG. 3, the controller determines whether the analog data that has been measured in the substrate treatment which has used a specific recipe exceeds an allowable threshold which corresponds to the recipe and has been determined beforehand. When it has been determined that the analog data exceeds the allowable threshold, the controller notifies the user that a "relating module" which has been associated with the analog data beforehand has deteriorated, in step SC. The user who has received the notification examines the target module in step SD, and takes necessary measures.

To give a specific example, in the case where MFC 50 and MFC 54 have deteriorated due to aging through the treatment of a large number of product substrates, and the analog data which has been measured by the MFCs has exceeded allowable thresholds, the case means that signs of failures of MFC 50 and MFC 54 have been detected; and the controller raises an alarm for the predictive maintenance. According to one example, the user specifies which recipe has provided the analog data that has caused the alarm, and thereby can find that the treatment by the recipe has imposed a large load onto the relating module.

On the other hand, in the case where it has been determined in step SA that the analog data does not exceed the allowable threshold, the case means that there is no sign of failure of the relating module, and the controller determines that the result is acceptable, in step SB. In response to the acceptance determination, the controller returns the process to step SA, subjects a next substrate to the treatment, and compares the analog data with the allowable threshold again. When the same recipe as the previous recipe is used, the same allowable threshold as the previous one is used, and when a recipe different from the previous recipe is used, an allowable threshold corresponding to the changed recipe is used.

Thus, the controller compares the analog data with the allowable threshold for each recipe, and thereby, the user finds that a load onto the module is small in one recipe, but the load on the module becomes large in another recipe. In other words, the controller determines whether the analog data has exceeded the allowable threshold for each of the substrate treatment with the use of the plurality of recipes having different contents, and then the user finds that a specific recipe particularly deteriorates the module. For example, the user finds that in a recipe in which a specific gas flows, the MFC 50 significantly deteriorates. In such a case, the user can obtain an opportunity to change the recipe to a recipe imposing a small load onto the module, or to adjust the recipe so that the load on the module becomes small, as a part of the predictive maintenance.

According to one example, the controller can calculate a degree of safety, which indicates how much a plurality of analog data obtained according to a plurality of recipes have margins from a plurality of allowable thresholds that have been determined beforehand for the plurality of recipes. The higher the degree of safety, the closer the analog data is to an average value obtained in the monitoring phase. In other words, a recipe that provides a high degree of safety is considered to be a recipe that imposes a small load onto the module. Then, according to one example, the controller can specify a recipe which gives a particularly low degree of safety as a "high-load recipe".

According to one example, the controller automatically or manually changes the high-load recipe. According to another example, the controller automatically or manually reduces a frequency of use of the high-load recipe. According to still another example, if a high-load recipe has been found, the controller can change the module that has been associated with the analog data beforehand, which has provided the high-load recipe, to a module which is resistant to the high-load recipe.

The above predictive maintenance may be performed on modules associated with one chamber, or may be applied to multiple chamber modules, for example, four chamber modules of a Quad Chamber Modules (QCM). When the above predictive maintenance is applied to modules associated with the QCM, the controller can eliminate or reduce the difference among the chambers of the QCM.

Figure 4:
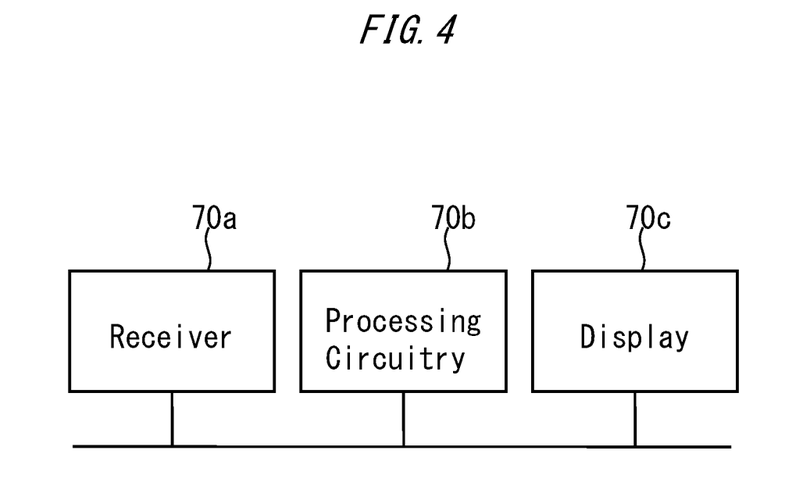
FIG. 4 is a view illustrating a configuration example of a hardware.

Next, Examples will be described. FIG. 4 is a view illustrating a configuration example of a predictive maintenance device. This predictive maintenance device includes processing circuitry 70*b* for performing all or at least a part of the above process. The processing circuitry 70*b* can perform at least the learning phase and the monitoring phase described above. The processing circuitry may be dedicated hardware, or may be a CPU (also referred to as Central Processing Unit, central processor unit, processing unit, arithmetic unit, microprocessor, microcomputer, processor or DSP) that executes a program which is stored in a memory.

FIG. 4 is a block diagram of the predictive maintenance device in a case where the processing circuitry 70*b* is dedicated hardware. The predictive maintenance device includes a receiver 70*a*, processing circuitry 70*b*, and an output device 70*c*. The receiver 70*a* receives the analog data measured by substrate treatment which has used a recipe. The processing circuitry 70*b* corresponds to, for example, single circuitry, composite circuitry, a programmed processor, a parallel programmed processor, an ASIC, an FPGA, or a combination thereof. The functions of the predictive maintenance device may be realized by the respective pieces of processing circuitry, or the functions may be collectively realized by the processing circuitry. According to one example, the processing circuitry functions as a controller that determines whether the analog data exceeds an allowable threshold which has been determined beforehand for the recipe. The output device 70*c* transmits voice, an image, an alarm signal to another device, and the like. The output device 70*c* is a display that notifies the user that the relating module associated with an analog data beforehand has deteriorated, for example, in the case where it has been determined that the analog data exceeds the allowable threshold in the monitoring phase.

Figure 5:
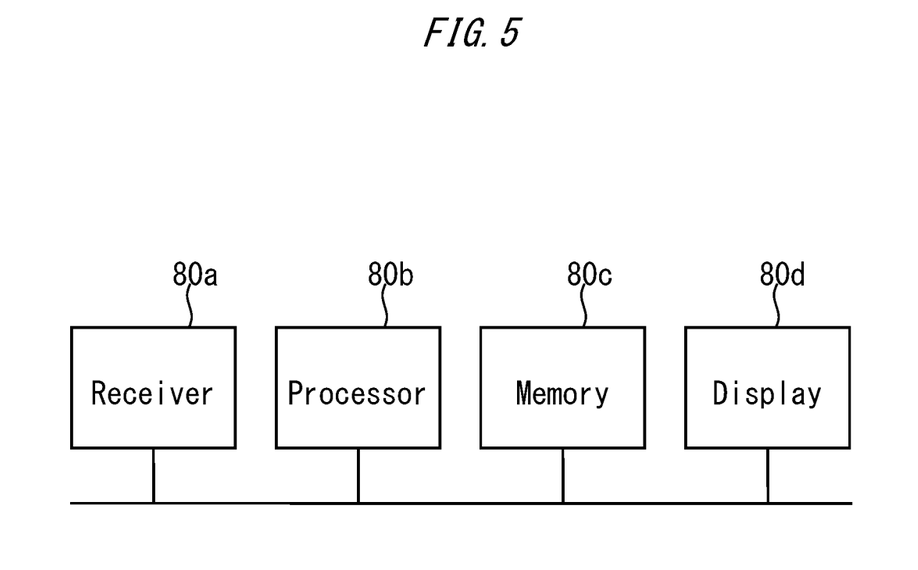
FIG. 5 is a view illustrating another configuration example of a hardware.

FIG. 5 is a block diagram illustrating a configuration example of a predictive maintenance device in a case where processing circuitry is a CPU. In this case, the above series of processes is controlled by a program. In other words, the flows of FIGS. 2 and 3 are automatically performed. When the processing circuitry 80*b* is a CPU as illustrated in FIG. 5, each function of the predictive maintenance device is realized by software, firmware, or a combination of software and firmware. The software or the firmware is described as a program, and is stored in a computer-readable storage medium 80*c*. Information on the allowable threshold and the relating module is also stored in the storage medium 80*c*. Briefly, this program causes a computer to specify a recipe, then compare analog data with an allowable threshold, and issue an alarm when the analog data exceeds the allowable threshold.

In any configuration of FIGS. 4 and 5, the processing circuitry functioning as the controller can calculate a degree of safety, which indicates how much a plurality of analog data obtained according to treatments by a plurality of recipes have margins from a plurality of allowable thresholds that have been determined for the plurality of recipes, and can specify a high-load recipe that is a recipe giving a lower degree of safety than that of the criterion. Then, the controller notifies the user that the high-load recipe is to be changed; notifies the user that the frequency of use of the high-load recipe is to be suppressed; or notifies the user that a module which has been associated with analog data beforehand, to which the high-load recipe has been given, is to be changed to a module that is resistant to the high-load recipe. The notification is performed by the output device.

Figure 6:
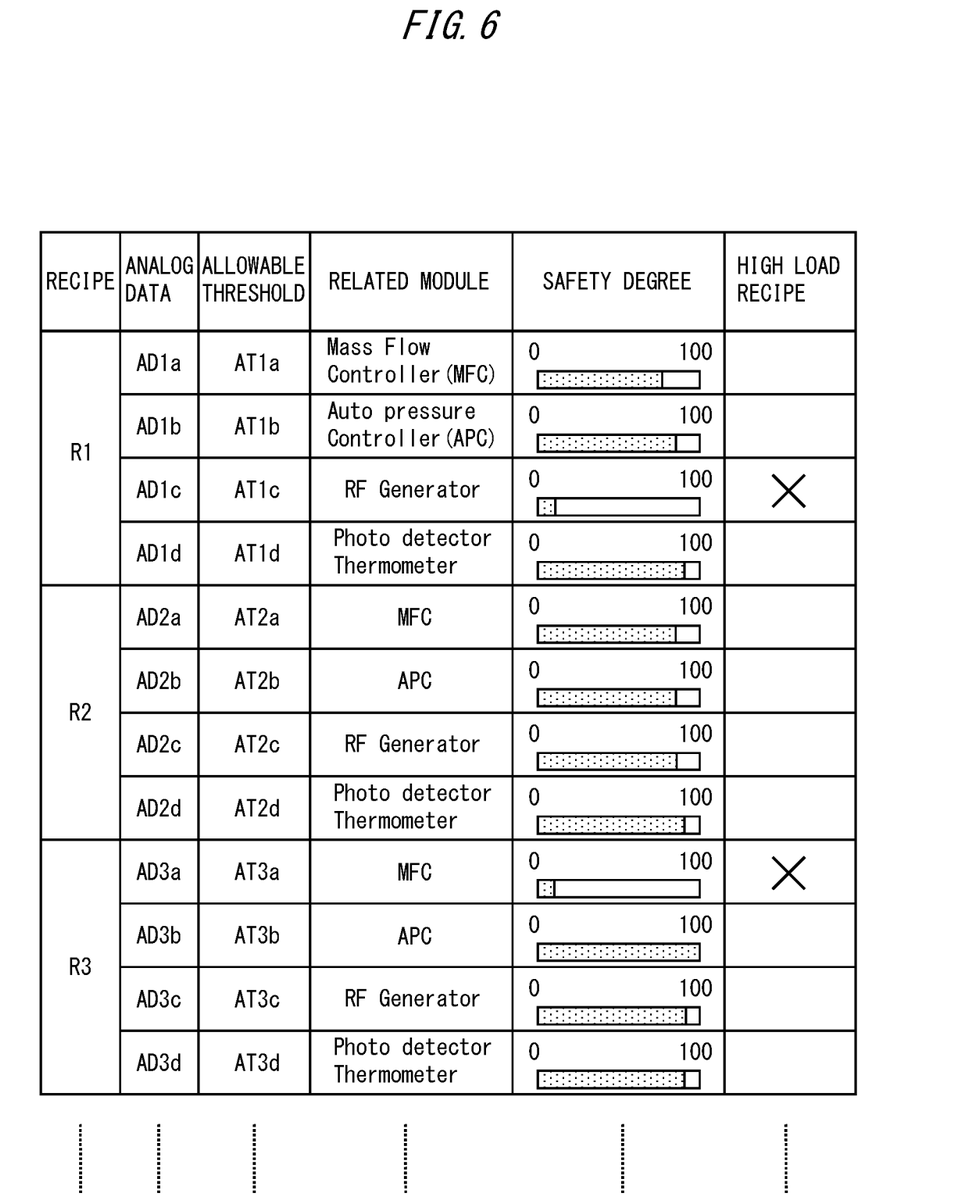
FIG. 6 is a view illustrating an example of data stored in a storage medium.

FIG. 6 is a table showing Examples. FIG. 6 shows that the controller monitors four analog data for each of recipes R1, R2 and R3. Allowable thresholds and relating modules are set for all analog data to be monitored. Furthermore, for all analog data, degrees of safety are displayed, which indicate how much the latest analog data have margins from the allowable thresholds. In this example, as for the degree of safety, the column of the high-load recipe is checked for analog data which gives a lower degree of safety than that of a predetermined standard. As shown in the examples of FIG. 6, the user convenience is improved by setting the degree of safety in a list format.

The method or the device exemplified so far includes monitoring the analog data in association with the recipe, and thereby detecting the deterioration of the module due to aging. Accordingly, the method and the device can obtain various information for improving the system or improving the recipe, as compared with the case of simply maintaining or periodically inspecting the module.

The invention claimed is:
1. A predictive maintenance method comprising:
providing a system with a plurality of modules and that is configured to run a plurality of recipes, wherein each of the plurality of modules has a different output data, wherein each of the plurality of recipes has a plurality of output data corresponding to the different output data of each of the plurality of modules, wherein the system is configured to measure and record the plurality of output data from the plurality of modules of the system while running each of the plurality of recipes;

determining a plurality of allowable thresholds for each of the plurality of output data for each of the plurality of recipes, wherein determining an allowable threshold for each of the plurality of output data comprises:
obtaining an average value for each of the plurality of output data for each of the plurality of modules in treatment of a plurality of dummy wafers; and
determining the allowable threshold for each of the plurality of output data on the basis of the average value;
after determining the plurality of allowable thresholds for each of the plurality of output data, performing a substrate treatment using a first recipe of a first substrate and measuring a first set of data in a substrate treating, wherein the first set of data comprises the plurality of output data for each of the plurality of modules measured while running the first recipe;
determining whether any data of the first set of data measured in a substrate treatment that has used the first recipe exceeds the allowable threshold for each of the plurality of output data for the first recipe;
calculating a degree of safety for each of the plurality of output data for the first recipe, wherein calculating a degree of safety comprises calculating the margin between the measured data and the allowable threshold;
notifying, in a case where it is determined that any data of the first set of data exceeds the allowable threshold in the determination, a user that the module associated with the data that has exceeded the allowable threshold has deteriorated,
specifying whether the first recipe is a high-load recipe for the system, wherein the high-load recipe is a recipe which provides a lower degree of safety than that of a predetermined criterion, and
changing, suppressing a frequency of use of, or restricting from the system the high-load recipe.

2. The predictive maintenance method according to claim 1, wherein
the first set of data comprises a flow rate output signal of a mass flow controller, and
the plurality of modules comprise the mass flow controller.

3. The predictive maintenance method according to claim 1, wherein
the first set of data comprises a pressure signal of an auto pressure controller, and
the plurality of modules comprise the auto pressure controller.

4. The predictive maintenance method according to claim 1, wherein
the first set of data comprises a signal measured by an RF generator, a signal detected by a photodetector, or a signal measured by a temperature measuring device.

5. The predictive maintenance method according to claim 1, comprising changing the high-load recipe.

6. The predictive maintenance method according to claim 1, comprising suppressing a frequency of use of the high-load recipe.

7. The predictive maintenance method according to claim 1, comprising restricting the high-load recipe from the system.

8. The predictive maintenance method according to claim 1, wherein the system comprises a plurality of reaction chambers and wherein the method is performed for each of the plurality of reaction chambers.

9. A system with predictive maintenance device, the system comprising:
a plurality of modules, wherein the system is configured to run a plurality of recipes, wherein each of the plurality of modules has a different output data, wherein each of the plurality of recipes has a plurality of output data corresponding to the different output data of each of the plurality of modules, wherein the system is configured to measure and record the plurality of output data from the plurality of modules of the system while running each of the plurality of recipes;
a receiver configured to receive the plurality of output data measured in a substrate treatment which has used a first recipe of the plurality of recipes;
a controller configured to determine whether the plurality of output data exceeds an allowable threshold, wherein the allowable threshold has been calculated beforehand for the first recipe by processing a plurality of substrates using the first recipe, wherein the controller calculates the allowable threshold for each of the plurality of output data for the first recipe based on the average value across the plurality of substrates for each of the plurality of output data for the first recipe, and wherein the controller is configured to calculate each of degrees of safety, wherein calculating a degree of safety comprises calculating the margin between the plurality of output data and the allowable threshold; and
a display configured to notify a user that a relating module which has been associated with the plurality of output data beforehand has deteriorated, in a case where it is determined that the plurality of output data exceeds the allowable threshold in the determination,
wherein the controller is further configured to specify whether the first recipe is a high-load recipe, wherein the high-load recipe is a recipe which provides a degree of safety below a predetermined threshold, and
wherein the controller is configured to suppress a frequency of use of, restrict the use of, or change the high-load recipe.

10. The system according to claim 9, wherein the controller comprises a storage medium configured to store the plurality of recipes and a plurality of allowable thresholds corresponding to the plurality of recipes.

11. The system according to claim 9, wherein the received plurality of output data comprises a flow rate output signal of a mass flow controller.

12. The system according to claim 11, wherein the controller is configured to notify a user that the high-load recipe is to be changed.

13. The system according to claim 11, wherein the controller is configured to notify a user that a frequency of use of the high-load recipe is to be suppressed.

14. The system according to claim 11, wherein in a case where the high-load recipe has been found, the controller is configured to notify a user that a module which has been associated with the plurality of output data beforehand, to which the high-load recipe has been given, is to be changed to a module that provides a higher degree of safety to the high-load recipe.

15. The system according to claim 11, wherein the controller is configured to suppress a frequency of use of the high-load recipe.

16. The system according to claim 11, wherein the controller is configured to restrict the use of the high-load recipe.

17. The system according to claim 11, wherein the controller is configured to change the high-load recipe.

* * * * *